US006758408B2

(12) United States Patent
Czimmek

(10) Patent No.: US 6,758,408 B2
(45) Date of Patent: Jul. 6, 2004

(54) METALLURGICAL AND MECHANICAL COMPENSATION OF THE TEMPERATURE RESPONSE OF TERBIUM-BASED RARE-EARTH MAGNETOSTRICTIVE ALLOYS

(75) Inventor: Perry Robert Czimmek, Williamsburg, VA (US)

(73) Assignee: Siemens Automotive Corporation, Auburn Hills, MI (US)

(*) Notice: Subject to any disclaimer, the term of this patent is extended or adjusted under 35 U.S.C. 154(b) by 311 days.

(21) Appl. No.: 09/909,828

(22) Filed: Jul. 23, 2001

(65) Prior Publication Data

US 2002/0030118 A1 Mar. 14, 2002

Related U.S. Application Data

(60) Provisional application No. 60/219,656, filed on Jul. 21, 2000.

(51) Int. Cl.⁷ .............................. F02D 7/00; B05B 1/30; B05B 1/08
(52) U.S. Cl. ...................... 239/5; 239/102.2; 239/585.1
(58) Field of Search ........................... 239/102.2, 585.1, 239/585.2, 585.3, 585.4, 585.5, 5

(56) References Cited

U.S. PATENT DOCUMENTS

| 4,308,474 A | 12/1981 | Savage et al. |
| 4,437,644 A | 3/1984 | Wilmers |
| 4,609,402 A | 9/1986 | McMasters |
| 4,927,334 A | 5/1990 | Engdahl et al. |
| 5,039,943 A | 8/1991 | Weber et al. |
| 5,184,037 A | 2/1993 | Kobayashi et al. |
| 5,280,773 A | 1/1994 | Henkel |
| 5,361,053 A | 11/1994 | Hosokawa et al. |
| 5,406,153 A | 4/1995 | Flatau et al. |
| 5,460,593 A | 10/1995 | Mersky et al. |
| 5,501,425 A * | 3/1996 | Reinicke et al. ........ 251/129.15 |
| 5,697,554 A | 12/1997 | Auwaerter et al. |
| 5,868,375 A | 2/1999 | Reinicke et al. |
| 6,026,847 A | 2/2000 | Reinicke et al. |
| 6,037,682 A | 3/2000 | Shoop et al. |
| 6,071,750 A | 6/2000 | Silverbrook |
| 6,230,799 B1 * | 5/2001 | Slaughter et al. ........... 166/249 |
| 6,279,842 B1 * | 8/2001 | Spain ...................... 239/585.1 |
| 6,298,829 B1 * | 10/2001 | Welch et al. ............... 123/467 |
| 6,307,286 B1 * | 10/2001 | Yamazaki et al. ..... 251/129.01 |
| 6,499,536 B1 * | 12/2002 | Ellingsen .................... 166/248 |

FOREIGN PATENT DOCUMENTS

| EP | 0 405 360 | 1/1991 |
| EP | 0 997 953 | 5/2000 |

* cited by examiner

Primary Examiner—Robin O. Evans

(57) ABSTRACT

An improved magnetostrictive actuator is provided. The actuator includes combinations of magnetostrictive alloy compositions and prestress values to provide improved temperature response for automotive applications, such as fuel injectors, without the need for complex electronic controls.

18 Claims, 11 Drawing Sheets

1

METALLURGICAL AND MECHANICAL COMPENSATION OF THE TEMPERATURE RESPONSE OF TERBIUM-BASED RARE-EARTH MAGNETOSTRICTIVE ALLOYS

This application claims the benefit of U.S. Provisional Application No. 60/219,656 filed Jul. 21, 2000, which is hereby incorporated by reference in its entirety.

FIELD OF THE INVENTION

This invention relates to magnetostrictive actuators, and more particularly to automotive actuators, such as fuel injectors and electronic valve timing actuators that operate based on the principle of magnetostrictive transduction. Still more particularly, this invention relates to magnetostrictive alloy compositions formulated to provide improved temperature response for automotive applications without the need for complex electronic controls and a method and apparatus using the same. Still more particularly, this invention relates to the application of optimal or near-optimal prestress forces to the magnetostrictive alloy compositions to improve the magnetostrictive response.

BACKGROUND OF THE INVENTION

A conventional method of actuating fuel injectors is by use of an electromechanical solenoid arrangement. The solenoid is typically an insulated conducting wire wound to form a tight helical coil. When current passes through the wire, a magnetic field is generated within the coil in a direction parallel to the axis of the coil. The resulting magnetic field exerts a force on a moveable ferromagnetic armature located within the coil, thereby causing the armature to move a needle valve into an open position in opposition to a force generated by a return spring. The force exerted on the armature is proportional to the strength of the magnetic field; the strength of the magnetic field depends on the number of turns of the coil and the amount of current passing through the coil.

In the conventional fuel injector, the point at which the armature, and therefore the needle, begins to move varies primarily with the spring preload holding the injector closed, the friction and inertia of the needle, fuel pressure, eddy currents in the magnetic materials, and the magnetic characteristics of the design, e.g., the ability to direct flux into the working gap. Generally, the armature will not move until the magnetic force builds to a level high enough to overcome the opposing forces. Likewise, the needle will not return to a closed position until the magnetic force decays to a low enough level for the closing spring to overcome the fuel flow pressure and needle inertia. In a conventional injector design, once the needle begins opening or closing, it may continue to accelerate until it impacts with its respective end-stop, creating wear in the needle valve seat, needle bounce, and unwanted vibrations and noise problems.

Magnetostrictive fuel injectors are believed to solve many of these problems by providing a fuel injector actuation method that provides reduced noise, longer seat life, elimination of bounce, and full actuator force applied during the entire armature stroke. The term "magnetostriction" literally means magnetic contraction, but is generally understood to encompass the following similar effects associated with ferromagnetic materials: the Guillemin Effect, which is the tendency of a bent ferromagnetic rod to straighten in a longitudinal magnetic field; the Wiedemann Effect, which is the twisting of a rod carrying an electric current when placed in a magnetic field; the Joule Effect, which is a gradual increasing of length of a ferromagnetic rod when subjected to a gradual increasing longitudinal magnetic field; and the Villari Effect, which is a change of magnetic induction in the presence of a longitudinal magnetic field (Inverse Joule Effect).

The dimensional changes that occur when a ferromagnetic material is placed in a magnetic field are normally considered undesirable effects because of the need for dimensional stability in precision electromagnetic devices. Therefore, manufacturers of ferromagnetic alloys often formulate their alloys to exhibit very low magnetostriction effects. All ferromagnetic materials exhibit magnetic characteristics because of their ability to align magnetic domains. As shown in FIG. 1, strongly magnetostrictive materials characteristically have domains that are longer in the direction of their polarization (North/South) and narrower in a direction perpendicular to their polarization, thus allowing the domains to change the major dimensions of the ferromagnetic material when the domains rotate.

For example, the magnetostrictive alloy Terfenol-D (e.g., $Tb_{0.3}Dy_{0.7}Fe_{1.9}$), is capable of approximately 10 um displacements for every 1 cm of length exposed to an approximately 500 Oersted magnetizing field. The general equation for magnetizing force, H, in Ampere-Turns per meter (1 Oersted=79.6 AT/m) is: H=IN/L, where I=Amperes of current; N=number of turns; and L=path length.

Terfenol-D is often referred to as a "smart material" because of its ability to respond to its environment and exhibit giant magnetostrictive properties. However, in order to realize the full potential of a magnetostrictive actuator, it would be desirable for the amount of magnetostrictive elongation to be independent of temperature over the range of temperatures typically encountered in automotive applications. The conventional solution to temperature compensation of magnetostrictive materials requires the use of complex electronic controls to control the current in the coil to compensate for the non-linear temperature response in the magnetostrictive material. The present invention eliminates the need for such electronic compensation, thereby greatly reducing the complexity of the control system required to control the magnetostrictive actuator.

SUMMARY OF THE INVENTION

A magnetostrictively actuated fuel injector is provided. The fuel injector includes a body having an inlet port, an outlet port and a fuel passageway extending from the inlet port to the outlet port. A metering element is disposed proximate the outlet port. A magnetostrictive element is in operative contact with the metering element. The composition of the magnetostrictive element provides a substantially linear temperature response over the range of temperatures from approximately −40° C. to +150° C. A coil is proximate the magnetostrictive element such that, upon excitation of the coil, magnetic flux generated by the coil causes the magnetostrictive element to change length and actuate the metering element.

A compound for use in a magnetostrictive valve is also provided. The compound consists essentially of the formula: $Tb_xDy_{1-x}Fe_y$, wherein x ranges from about 0.31 to about 0.33 and y ranges from about 1.8 to about 2.2.

A method of using a compound of the formula $Tb_xDy_{1-x}Fe_y$ to form a fuel injector, wherein x ranges from about 0.31 to about 0.33 and y ranges from about 1.8 to about 2.2, is also provided. The method includes forming the compound into a magnetostrictive element for use as a magnetostrictive actuator in a fuel injector

BRIEF DESCRIPTION OF THE DRAWINGS

The accompanying drawings, which are incorporated herein and constitute part of this specification, illustrate presently preferred embodiments of the invention, and, together with the general description given above and the detailed description given below, serve to explain features of the invention.

DETAILED DESCRIPTION OF THE PREFERRED EMBODIMENT(S)

The presently preferred embodiments will be described primarily in relation to magnetostrictive fuel injectors. However, as will be appreciated by those skilled in the art, these embodiments are not so limited and may be applied to any type of actuator including, for example, electronic valve timing actuators or fuel pressure regulators.

Figure 1:
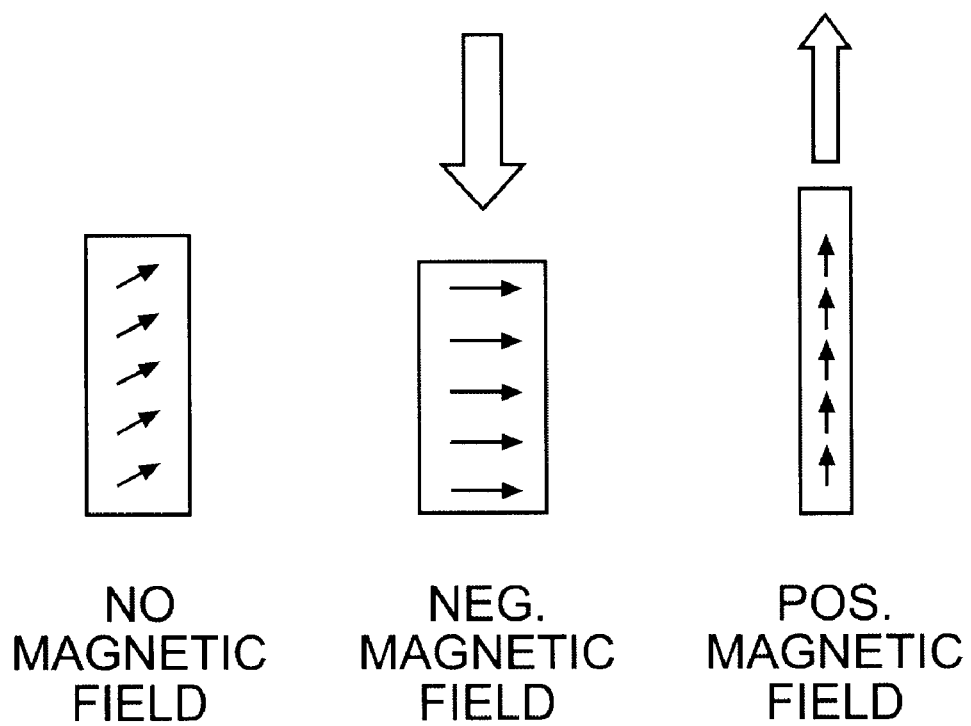
FIG. 1 is a sectional view of a magnetostrictive material illustrating the effect of an externally applied magnetic field on the orientation of magnetic domains within the material, and the corresponding effect on the outer dimensions of the material.
Figure 2:
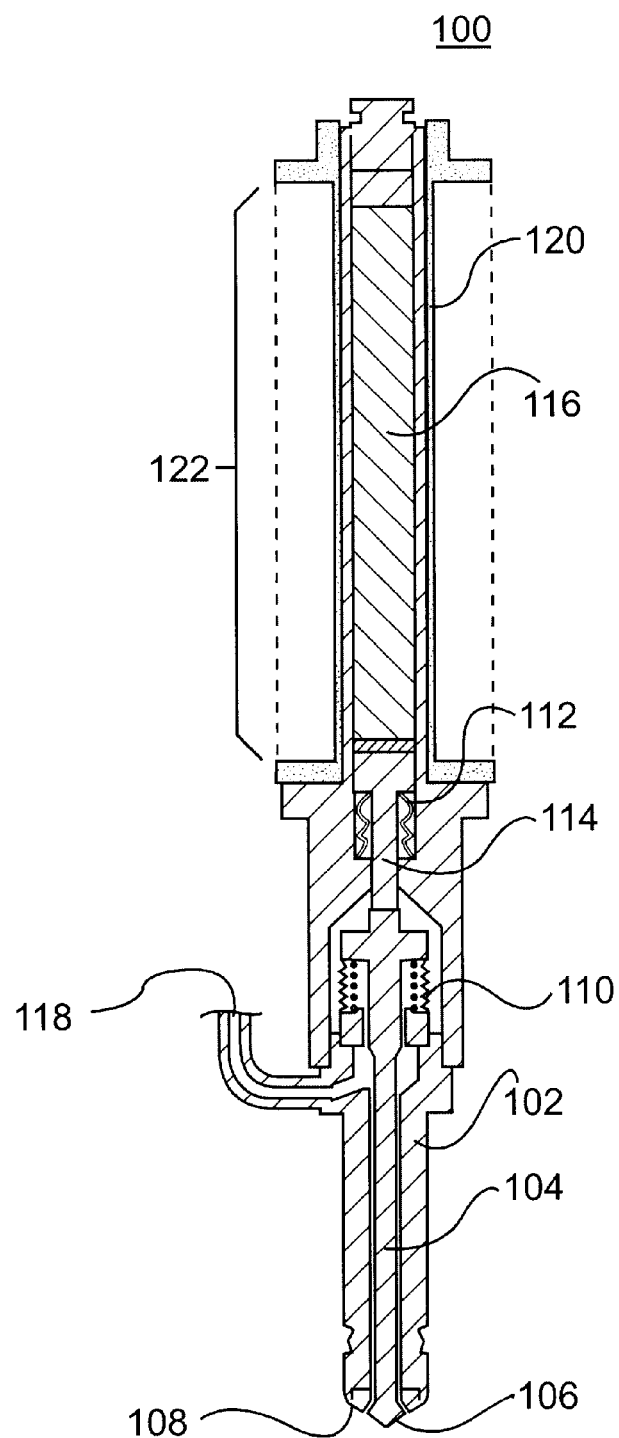
FIG. 2 is sectional view of a magnetostrictive fuel injector in accordance with a preferred embodiment of the present invention.

FIG. 2 illustrates an exemplary magnetostrictive fuel injector in accordance with a presently preferred embodiment. The fuel injector 100 comprises a valve body 102 and an injector needle 104 having a needle tip 106 forming a valve in conjunction with the injector seat 108. A closing spring 110 is operatively disposed to urge the needle tip 106 into a sealing position with the injector seat 108. A belleville spring stack 112 exerts a force on a moving plunger 114, which is coaxially aligned with the injector needle 104 and a magnetostrictive member 116. A fuel inlet 118 is operatively connected to the valve body 102. The magnetostrictive member 116 is coaxially arranged with a coil bobbin 120 having a coil winding 122. In preferred embodiments, the actuation of the injector can be in the form of an outward opening injector needle, as depicted in FIG. 2, or an inward opening injector needle (not shown).

In a presently preferred embodiment, the need for electronic temperature compensation for the control of the magnetostrictive elongation of a Terfenol-D actuator rod may be eliminated by selecting particular combinations of alloy formulations and prestress values, thereby providing for a magnetostrictive actuator with substantially constant lift at constant current without the need for complex electronic control circuitry.

Magnetostrictive alloys of the binary and pseudobinary varieties can be formulated to exhibit giant-magnetostriction for temperatures ranging from near absolute zero to over 250° C. According to a presently preferred embodiment, Terfenol-D, may be used in a magnetostrictive injector and formulated to require no control circuitry compensation to control the amount of magnetostrictive elongation. In order to determine a formulation of Terfenol-D alloy that would exhibit these properties, various formulations were evaluated at low temperatures. The optimum low temperature alloy was then tested at two prestress points at high temperatures. In this manner, it has been determined that the Terbium content can be increased in the Terfenol-D alloy to improve the low temperature response. It has further been determined that applying a compressive prestress force to the Terfenol-D can be used to improve the high temperature response. The combination of stoichiometry adjustment and prestress adjustment to optimize temperature response, as described herein, results in lift performance that can be held constant for a constant magnetic field (or current) within the typical automotive operating temperature range of approximately −40° C. to +150° C., without the need for any external control circuitry compensation.

Figure 3:
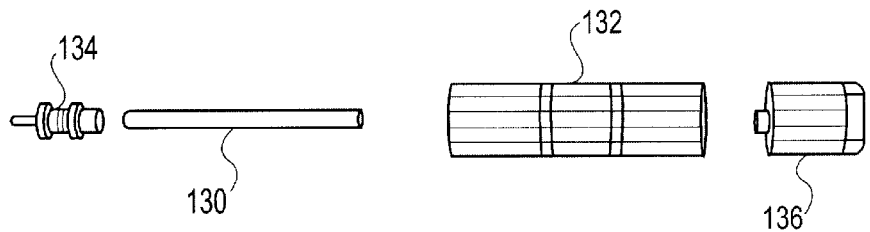
FIG. 3 is a view of a magnetostrictive testing apparatus in accordance with a preferred embodiment of the present invention.

According to a preferred embodiment, a method of optimizing the magnetostrictive displacement behavior, including non-linear and non-uniform magnetostrictive elongation effects, of Terfenol-D over a target temperature range (e.g., the typical automotive operating temperature range of approximately −40° C. to +150° C.) will now be described. A preferred method includes providing a magnetostrictive testing apparatus, preferably an actuator approximating the magnetic and mechanical architecture of an automotive magnetostrictive injector. FIG. 3 illustrates a magnetostrictive testing apparatus including at least one Terfenol-D rod 130 having the desired experimental alloy stoichiometries, a solenoid coil 132, and a prestress mechanism 134 to load the magnetostrictive member 130 to the minimum prestress required to produce near maximum magnetostriction (the prestress mechanism is optional, depending on the application and the particular characteristics of the magnetostrictive material). The solenoid coil 132 provides the necessary magnetizing force to cause the desired magnetostriction and the end cap 136 includes a pressure sensor.

The percent displacement of the Terfenol-D rods may then be measured for temperatures across the desired low temperature range (e.g., approximately −40° C. to +20° C. for automotive applications). In a preferred embodiment, the low temperature non-linearity may then be compensated for by selecting the Terbium content in the alloy $Tb_xDy_{1-x}Fe_y$, such that x=0.31 to 0.33 and y=1.8 to 2.2.

In a preferred embodiment, the high temperature magnetostrictive response may then be optimized for varying amounts of prestress. Preferably, a prestress range should be selected that will achieve the desired effect of substantially constant magnetostriction given a substantially constant magnetic field over the desired temperature range.

Figure 4:
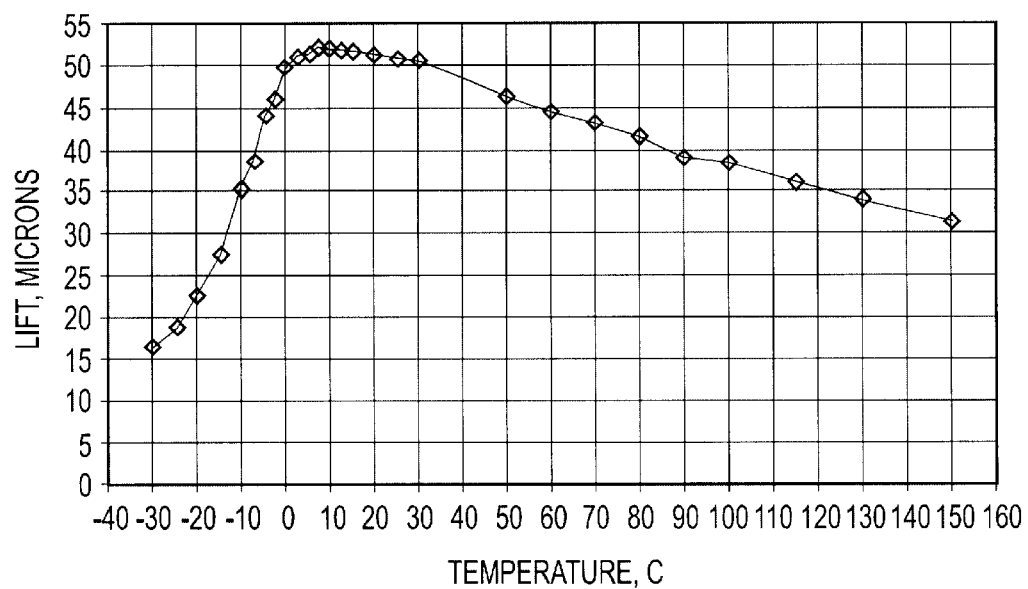
FIG. 4 depicts the composite temperature response for a standard formulation of Terfenol-D ($Tb_{0.30}Dy_{0.70}Fe_{1.92}$), optimized for a compromise between hysteresis and magnetostrictive elongation.

Accordingly, by utilizing certain combinations of Terbium, Dysprosium and Iron, nearly the entire range of positive magnetostrictive elongation, field sensitivity and operating temperatures can be attained. The stoichiometry of Terfenol-D, a pseudobinary alloy, falls predominately within the following range: $Tb_xDy_{1-x}Fe_y$; for 0<x<1; and 0<y<17. For example, the composite temperature response for a standard formulation of Terfenol-D ($Tb_{0.30}Dy_{0.70}Fe_{1.92}$), optimized for a compromise between hysteresis and elongation is depicted in FIG. 4. It has been determined that, as "y" increases, the Curie temperature decreases, while a value of approximately y=2 provides the highest Curie temperature (e.g., +438° C. for $TbFe_2$). Terfenol-D, like all ferromagnetic materials, has a Curie temperature corresponding to where full demagnetization occurs. Further, as "y" approaches zero, the magnetostriction decreases significantly with temperature increase. The absence of iron appears to result in Curie temperatures below about −30° C., approaching cryogenic.

The Tb/Dy relationship determines the magnetic anisotropy compensation temperature. Above the magnetic anisotropy temperature the highly magnetostrictive anisotropic axes are magnetically easy and magnetostriction follows magnetization, below the magnetic anisotropy temperature the nearly non-magnetostrictive axes are magnetically easy and magnetization is large compared to magnetostriction.

Figure 5:
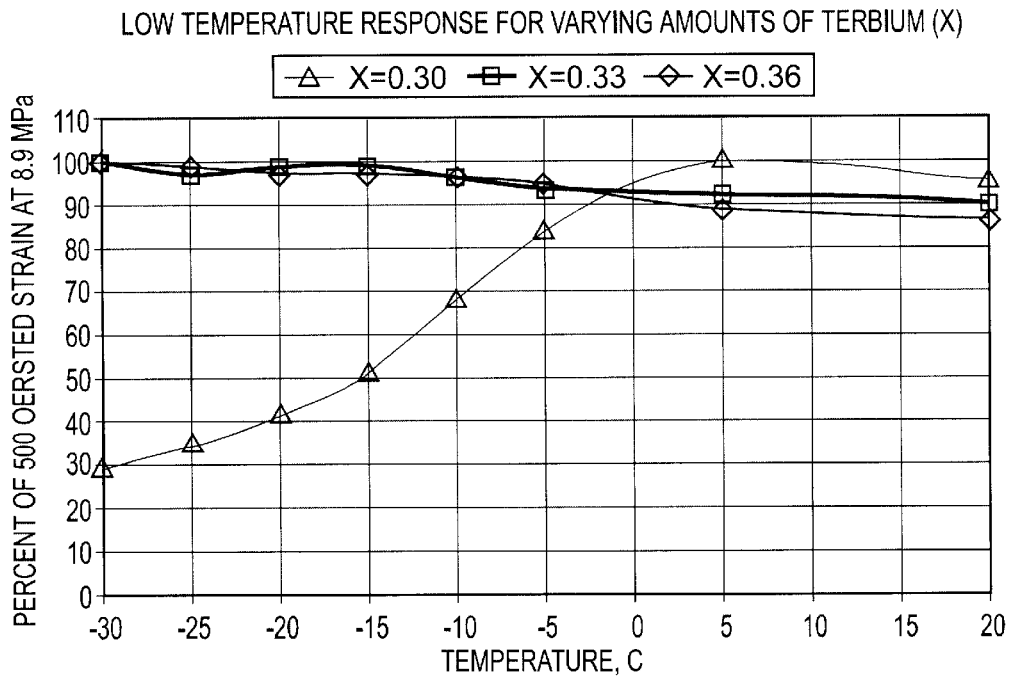
FIG. 5 depicts the low temperature response for varying amounts of Terbium.

For example, with reference to FIG. 5, in the Terfenol-D stoichiometry: $Tb_xDy_{1-x}Fe_y$, for x=0.3, the onset of the compensation temperature is at about 0° C.; for x<0.3 the onset moves to higher temperatures; and for x>0.3 the onset moves to lower temperatures. Therefore the peak in the temperature dependence can be moved by varying the Tb concentration, thereby optimizing for automotive use. Further, the slope of the demagnetostriction with temperature increase curve can be changed by changing the Fe concentration. The Tb/Dy relationship determines the low field hysteresis, which is an important factor for maximizing magnetostriction at a particular field strength.

It has been observed that the slope of the demagnetostriction with temperature curve varies not only with Fe concentration, but also with the operating point on the S-H curve (magnetostrictive strain, S, plotted against magnetic field intensity, H). There are several candidate variables that may be changed to move the relative position on the S-H curve. The heat treatment and the quality of the alloy affect strain at a particular field strength, but since these variables are optimized to maximize magnetostriction, it is usually undesirable to change these variables. The other candidate variables include magnetic field intensity and prestress.

Figure 6:
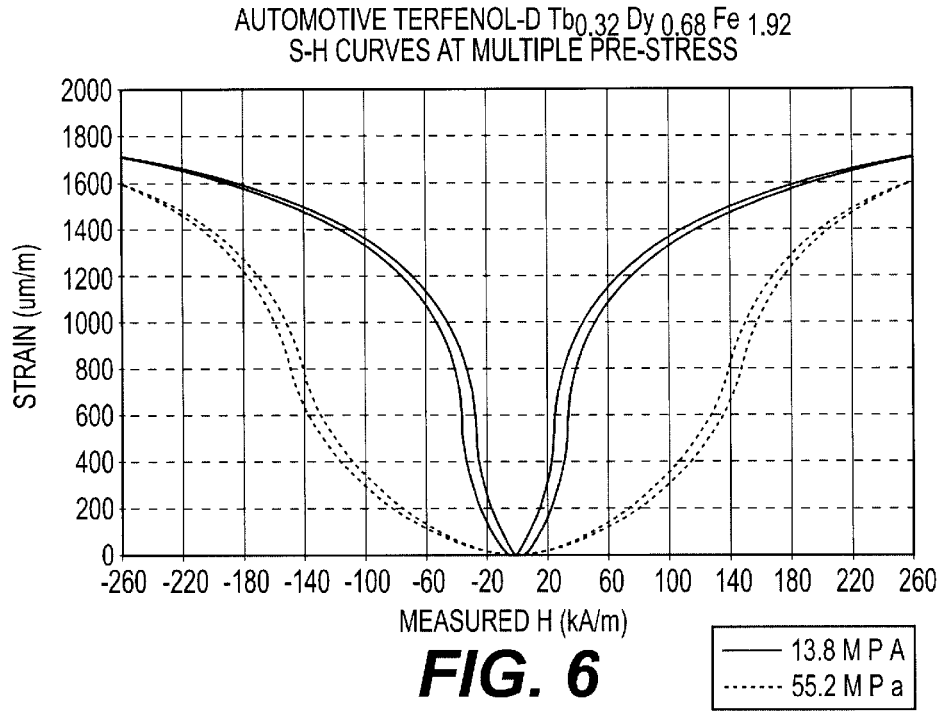
FIG. 6 illustrates the magnetostrictive hysteresis (S-H) curves for a preferred Terfenol-D alloy at two preferred values of prestress spanning a preferred range of prestress values in accordance with a preferred embodiment of the present invention.

By decreasing the magnetic field intensity, for example, from 500 Oersted to 250 Oersted at a constant prestress of 7.6 MPa, the response moves to a portion of the S-H curve where the demagnetostriction with temperature is nearly zero. This is undesirable for a highpressure injector application because of the elongation of the magnetostrictive element and, perhaps more importantly, force is sacrificed due to movement to a lower magnetic field intensity. As can be seen with reference to FIG. 6, by increasing the prestress at a constant field intensity, the entire S-H curve is moved, due to a change in the magnetic energy stored and magnetic energy expended in strain, resulting in a relative position lower on the S-H curve where the demagnetostriction with temperature is nearly zero. This variation of prestress to compensate for the high temperature response is more desirable because there is no loss of force and it offers increased mechanical stiffness, as well as the ability to "adjust and forget" in production.

The following working example illustrates the influence of stoichiometry on magnetostrictive temperature dependence, and was performed to verify above-described principles relating to compensating for the temperature response of Terfenol-D alloys.

Magnetostrictive Rods—The following magnetostrictive rods were used:

$1^{st}$ Material: Terfenol-D ($Tb_{0.30}Dy_{0.70}Fe_{1.92}$), Manufactured by ETREMA Products, Inc.

Rod No.: ecg 96–122A (puck tested); Dimensions: 4×4×50 mm

Growth Method: Modified Bridgeman (MB), ETREMA ECG $2^{nd}$ Material: Terfenol-D ($Tb_{0.33}Dy_{0.67}Fe_{1.92}$), Manufactured by Iowa State University for ETREMA Products, Inc.

Rod No.: MCM-18–07; Dimensions: 6.46 mm dia.×51.30 mm length

Growth Method: Free Stand Zone Melt (FSZM), unknown heat treat, twinned crystal performance 3$^{rd}$ Material: Terfenol-D (Th$_{0.36}$DY$_{0.64}$Fe$_{1.92}$), Manufactured by Iowa State University for ETREMA Products, Inc.

Rod No.: MCM-18–09 Dimensions: 6.46 mm dia.×51.30 mm length

Growth Method: Free Stand Zone Melt (FSZM), unknown heat treat, twinned crystal performance Coil Parameters—The coil parameters were as follows:

Bobbin Dimensions: 6.5 mm inside diameter, 0.9 mm wall thickness, 8.3 mm coil inside diameter, 52.5 mm coil length Bobbin Material: Nylon 6/6

Coil Winding: 6 layers, 710 total turns

Coil Wire: 26 AWG

20° C. Resistance: 3.28 Ohms 1 kHz Inductance: 2.08 mH, assembled, 1.31 mH, prestressed to 15 MPa Instrumentation—The following instrumentation was used:

Electronic Driver For Characterization of Phase I Actuator:

Voltage: 70 volts

Duty Cycle: 5%

Recording Device:

Tektronix Digital Oscilloscope Model TDS 744A

Position Measuring Instrument (hysteresis and temperature response of all three alloys):

Laser Interferometer: Polytec OFV3001 Controller, OFV303 Sensor Head Position Measuring Instrument (static lift measurement of preferred rod):

Mitutoyo Digimatic Indicator, 0.001 mm increments
Current Measuring Instrument:

Tektronix 5 MHz Current Probe Model TCP202
Load Cell:

Omegadyne LCGD-500, non-linearity=0.25% FSO, repeatability=0.10% FSO, 316SS housing Thermometer:

Fluke 52 K/J thermometer with Omega KMGSS-010U-12 K-type thermocouple (common for hot and cold test).

Procedure—The following procedure was followed:

All low temperature hysteresis measurements were performed at 500 Oersted magnetic field intensity (3 A) and 8.9 MPa prestress.

The percent of maximum magnetostriction was measured for Terfenol-D compositions having the following Terbium content (standard 0.30, 0.33, 0.36) and measured from −30° C. to +20° C. with 8 datapoints per alloy variation (−30° C., −25° C., −20° C., −15° C., −10° C., −5° C., +5° C., +20° C.).

The hysteresis measurements of each alloy subjected to 0–500–0 Oersted magnetic field intensity variation was captured digitally and plotted as a percent, with 100% at 500 Oersted.

The optimum performing magnetostrictive rod was selected and tested at −40° C., +20° C., and +60° C. for static lift at 500 Oersted magnetic field intensity and 6 MPa prestress.

The optimum magnetostrictive rod was also tested at optimum prestress and 2× optimum prestress for the response achieved at +20° C., +60° C. and +100° C. The prestress values selected were: 6 MPa and 12 MPa (6.2 MPa and 11.7 MPa, measured), respectively.

Results—The following results were obtained:

As can be seen in reference to FIG. 4, the standard ETREMA Terfenol-D with a Terbium content of x=0.30 displays demagnetostriction with temperature at a rate of about 0.30% per degree C. above about 5° C. Below about 5° C. the response is undesirably nonlinear and decreases quickly.

Figure 7:
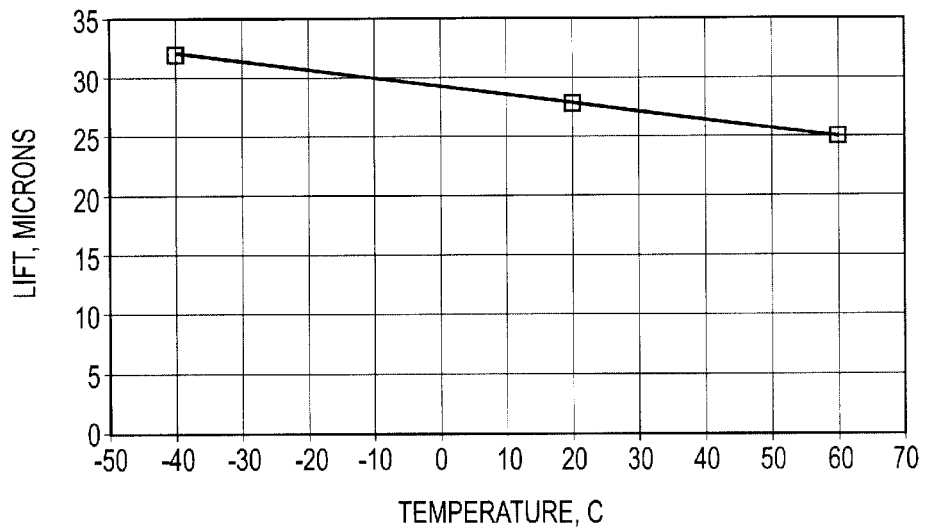
FIG. 7 illustrates the temperature response of a preferred Terfenol-D composition with a Terbium content of x=0.33 in accordance with a preferred embodiment of the present invention.

As can be seen in reference to FIG. 7, a preferred Terfenol-D composition with a Terbium content of x=0.33 displays a demagnetostriction with temperature at a rate of about 0.22% per degree C. above −40° C. and has a hysteresis close to the standard ETREMA Terfenol-D.

Figure 8:
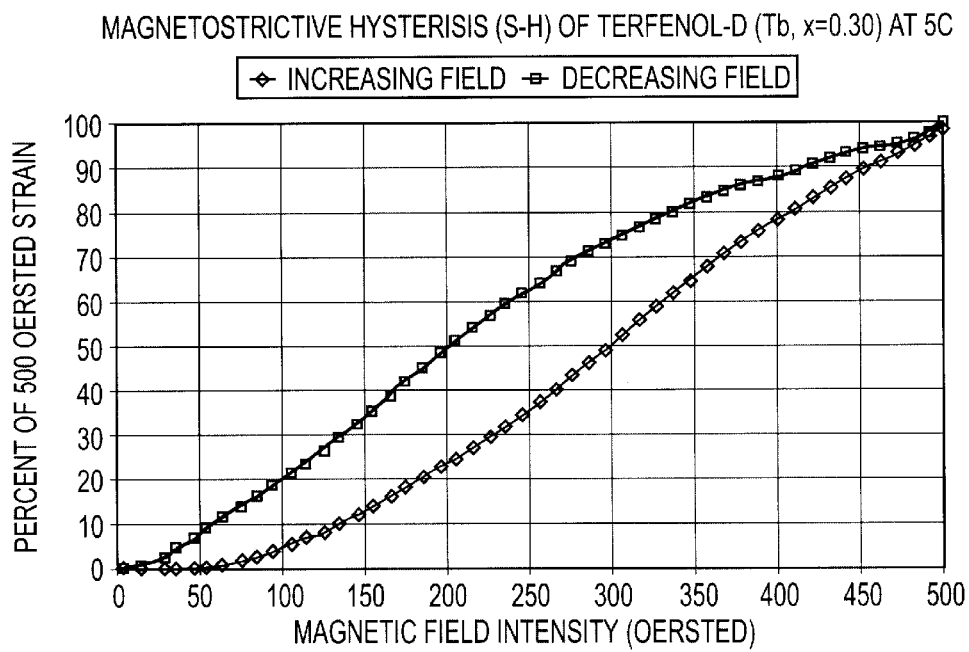
FIG. 8 illustrates the magnetostrictive hysteresis (S-H) of a Terfenol-D alloy with a Terbium content of x=0.30.
Figure 9:
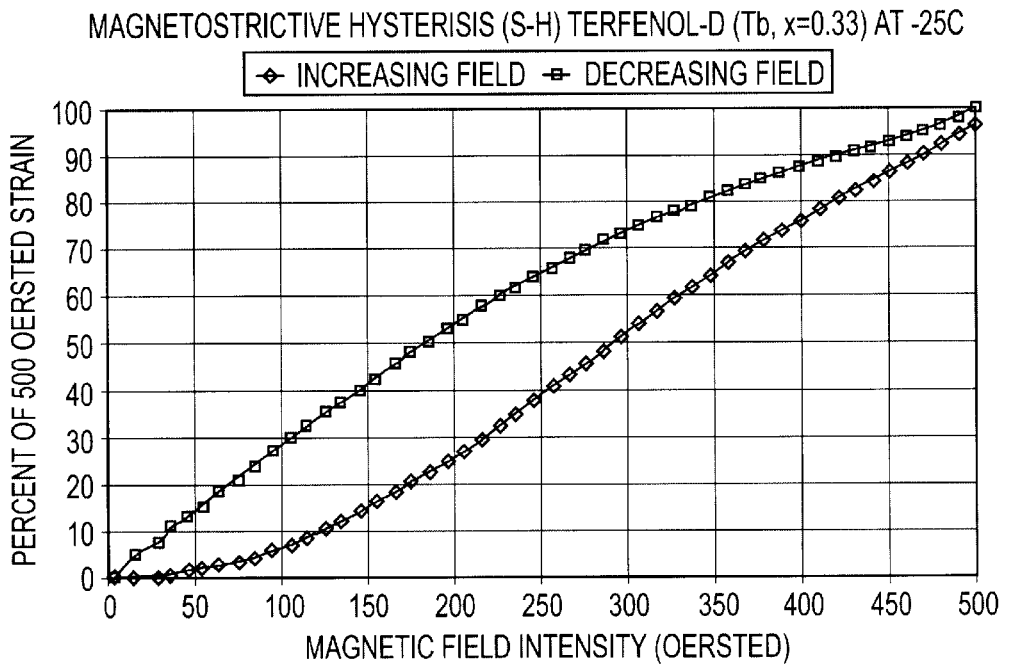
FIG. 9 illustrates the magnetostrictive hysteresis (S-H) of a Terfenol-D alloy with a Terbium content of x=0.33 in accordance with a preferred embodiment of the present invention.
Figure 10:
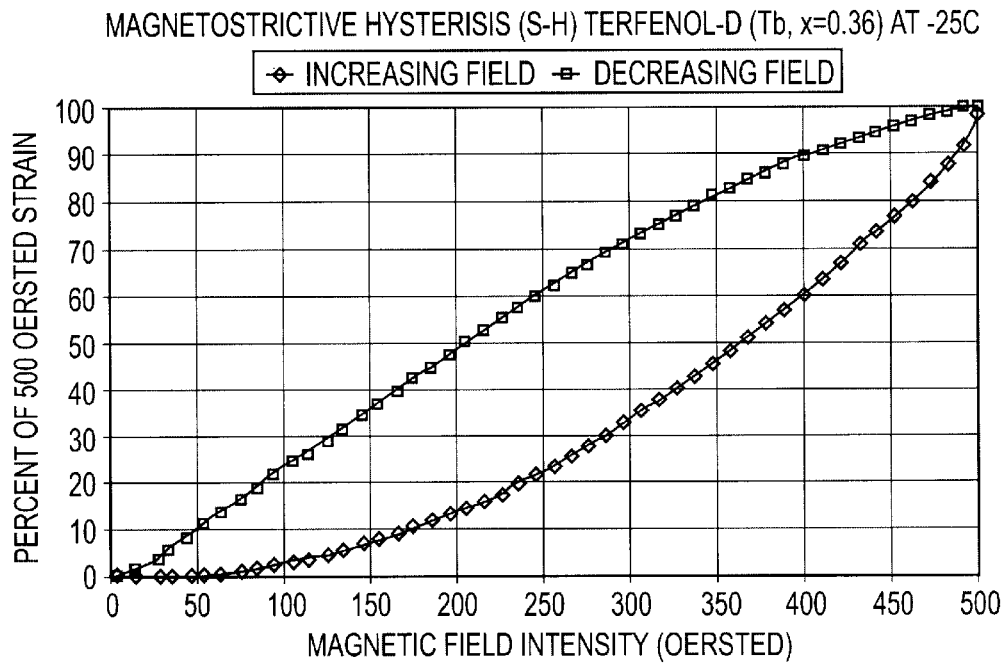
FIG. 10 illustrates the magnetostrictive hysteresis (S-H) of a Terfenol-D alloy with a Terbium content of x=0.36.

As can be seen by comparing FIGS. 8, 9 and 10, the experimental Terfenol-D with a Terbium content of x=0.36 displays undesirably large hysteresis and could have significantly less magnetostriction at the field strengths expected in an injector (<2000 Oersted) than either the x=0.30 or the x=0.33 stoichiometries.

Figure 11:
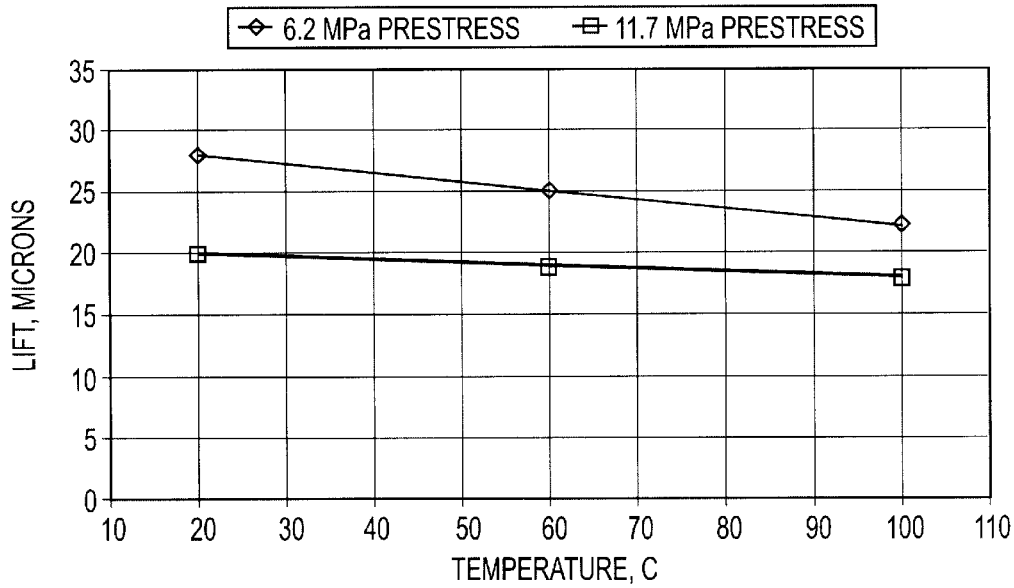
FIG. 11 illustrates the high temperature response of a Terfenol-D alloy with a Terbium content of x=0.33 at two prestress values in accordance with a preferred embodiment of the present invention.

Both the x=0.33 and x=0.36 compositions continue to display giant magnetostriction at low temperature. For an automotive injector application, stoichiometry with a Terbium content of 0.31<x<0.33 provides an optimal range for low temperature performance. From further testing of the x=0.33 stoichiometry at double the optimum prestress (see FIG. 11), it has been confirmed that the slope of the demagnetostriction curve can be negated by sacrificing the highest lift at a constant magnetic field. The balance of magnetic field intensity and prestress in order to maximize lift while retaining a constant lift from −40° C. to +150° C. provide the design constraints of the current and load relationship for an optimal injector. Given a constant driver current, the lift of the injector due to the magnetostrictive performance over the automotive temperature range will be nearly constant in a design according to the above principles.

Figure 12:
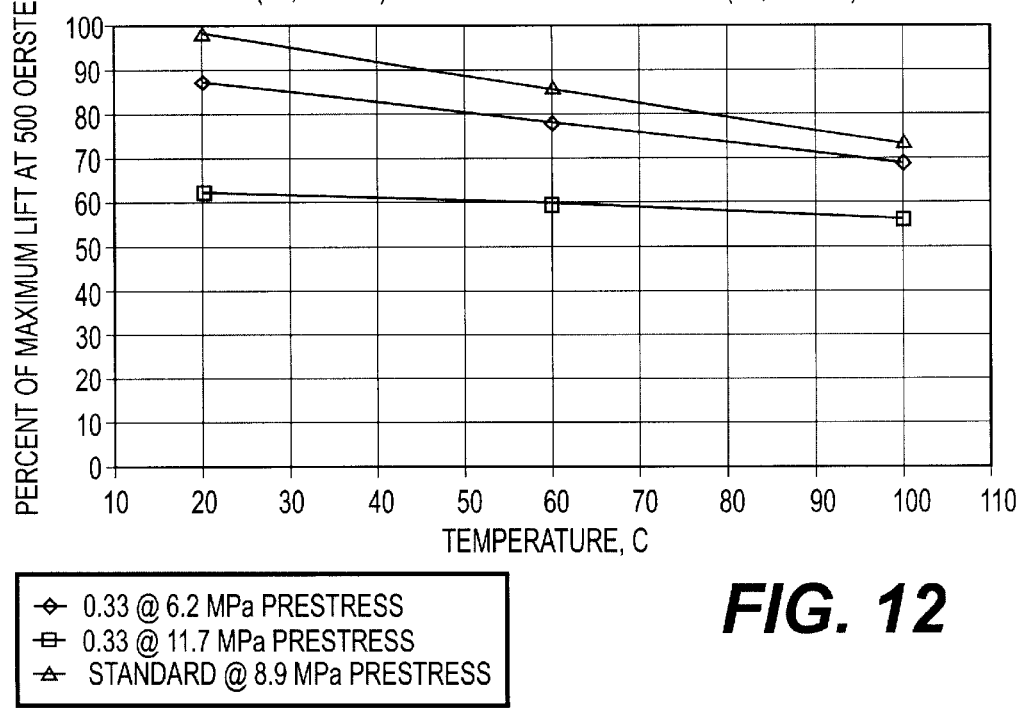
FIG. 12 depicts the high temperature response of a magnetostrictive rod having a standard Terfenol-D composition ($Tb_{0.30}Dy_{0.70}Fe_{1.92}$) compared with the high temperature response of a magnetostrictive rod having a preferred Terfenol-D composition of $Tb_{0.33}Dy_{0.67}Fe_{1.92}$, for both less than optimal prestress and more nearly optimal prestress values.

FIG. 12 depicts the high temperature response of a magnetostrictive rod having a standard Terfenol-D composition (Tb$_{0.30}$Dy$_{0.70}$Fe$_{1.92}$) compared with the high temperature response of a magnetostrictive rod having a preferred Terfenol-D composition of Tb$_{0.33}$Dy$_{0.67}$Fe$_{1.92}$ for both less than optimal prestress and more nearly optimal prestress values. As shown in FIG. 12, the slope of the demagnetostriction with temperature increase curve is reduced for Terfenol-D compositions having x>0.3 and for increasing prestress values.

Figure 13:
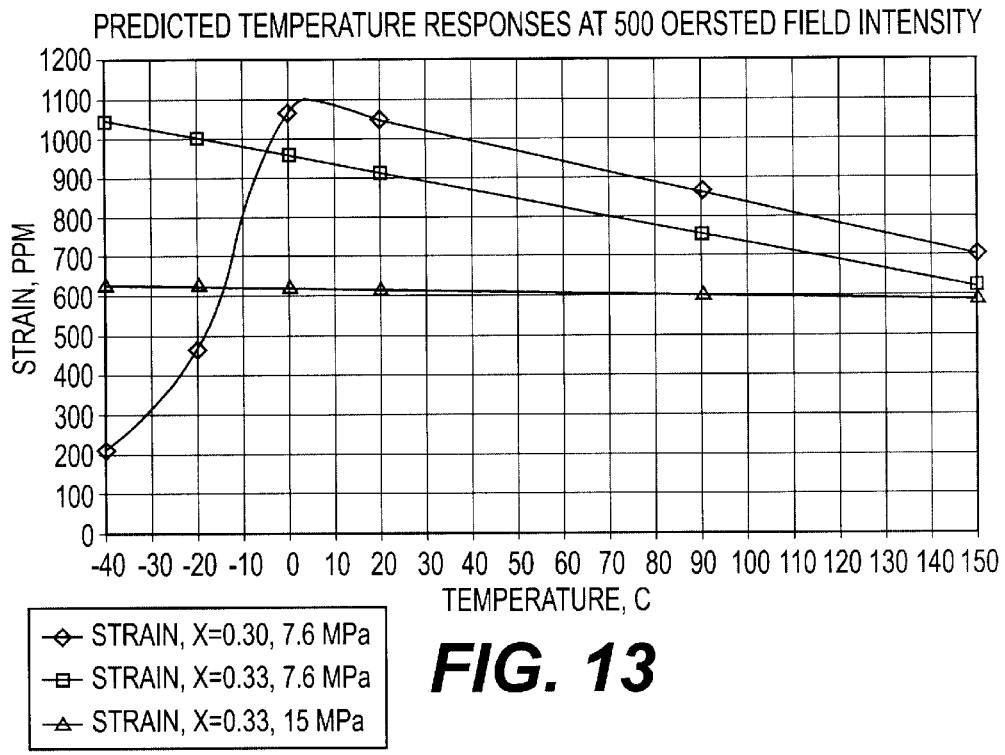
FIG. 13 depicts the predicted temperature response of a magnetostrictive rod having a standard Terfenol-D alloy composition ($Tb_{0.30}Dy_{0.70}Fe_{1.92}$) compared with the predicted temperature response of a magnetostrictive rod having a preferred Terfenol-D composition of $Tb_{0.33}Dy_{0.67}Fe_{1.92}$ for a nearly optimal prestress value of about 7.6 MPa.

FIG. 13 depicts the predicted temperature response of a magnetostrictive rod having a standard Terfenol-D alloy composition (Tb$_{0.30}$Dy$_{0.70}$Fe$_{1.92}$) compared with the predicted temperature response of a magnetostrictive rod having a preferred Terfenol-D composition of Tb$_{0.33}$Dy$_{0.67}$Fe$_{1.92}$ for a nearly optimal prestress value of about 7.6 MPa. FIG. 13 also depicts the predicted temperature response result for a preferred Terfenol-D composition having the formula Tb$_{0.33}$Dy$_{0.67}$Fe$_{1.92}$ at twice the nearly optimal prestress value (i.e., about 15 MPa).

Figure 14:
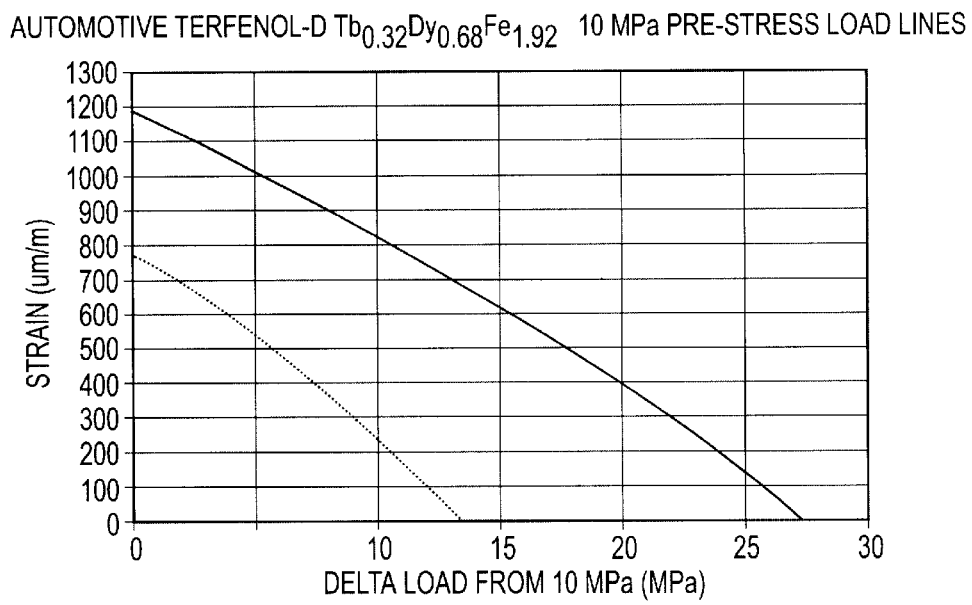
FIG. 14 depicts transducer measurement results characterizing the load response of a preferred Terfenol-D alloy $Tb_{0.32}Dy_{0.68}Fe_{1.92}$ at 10 MPa prestress in accordance with a preferred embodiment of the present invention.

FIG. 14 depicts transducer measurement results characterizing the load response of a preferred Terfenol-D alloy Tb$_{0.32}$Dy$_{0.68}$Fe$_{1.92}$ at 10 MPa prestress.

Figure 15:
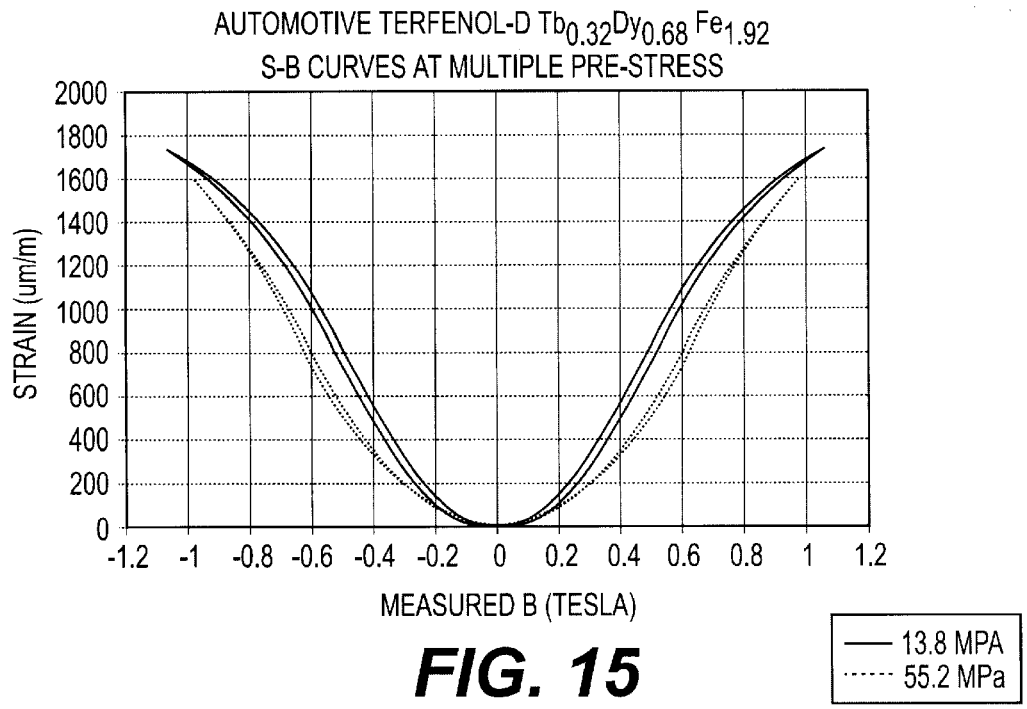
FIG. 15 depicts the magnetic characteristics (strain v. magnetic flux density) of a preferred Terfenol-D alloy $Tb_{0.32}Dy_{0.68}Fe_{1.92}$ at preferred prestress values in accordance with a preferred embodiment of the present invention.

FIG. 15 depicts the magnetic characteristics (strain v. magnetic flux density) of a preferred Terfenol-D alloy Tb$_{0.32}$Dy$_{0.68}$Fe$_{1.92}$ at preferred prestress values.

Figure 16:
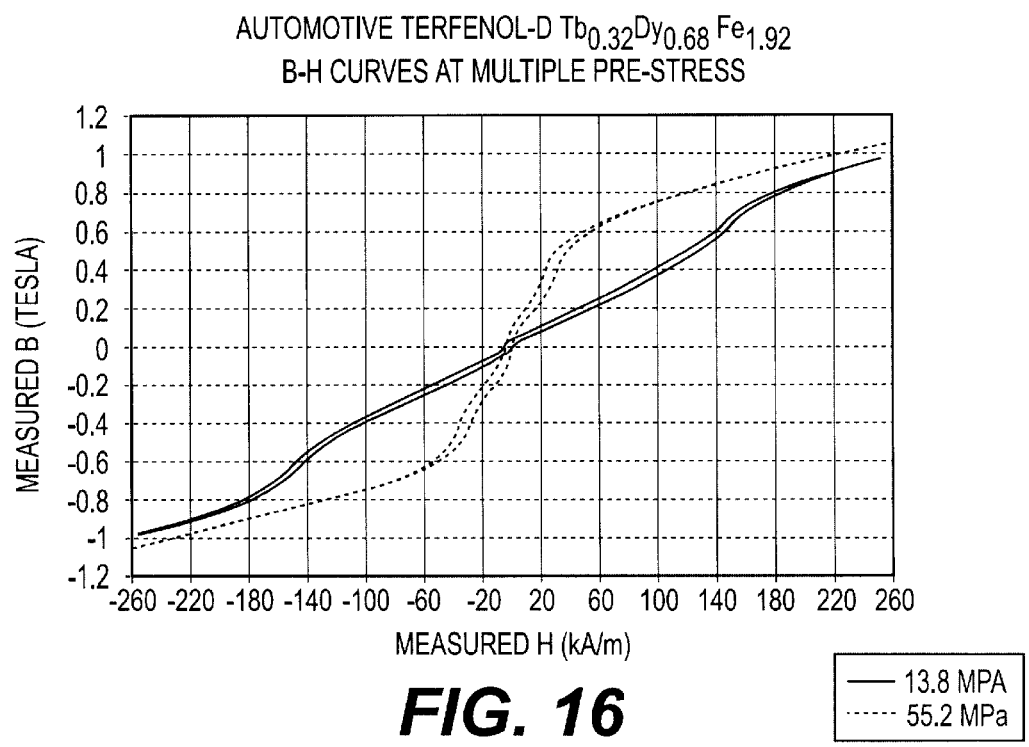
FIG. 16 depicts the magnetization characteristics of a preferred Terfenol-D alloy $Tb_{0.32}DY_{0.68}Fe_{1.92}$ at preferred prestress values in accordance with a preferred embodiment of the present invention.

FIG. 16 depicts the magnetization characteristics of a preferred Terfenol-D alloy Tb$_{0.32}$Dy$_{0.68}$Fe$_{1.92}$ at preferred prestress values.

Figure 17:
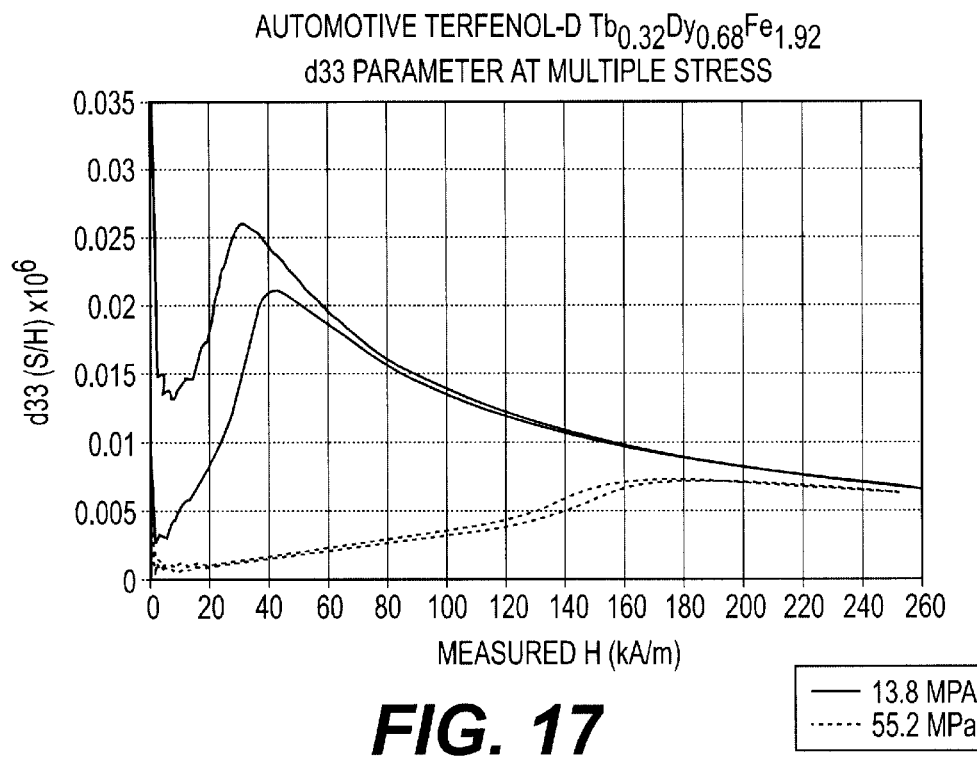
FIG. 17 depicts the magnetostrictive constant characteristic of a preferred Terfenol-D alloy $Tb_{0.32}Dy_{0.68}Fe_{1.92}$ in accordance with a preferred embodiment of the present invention.
Figure 18:
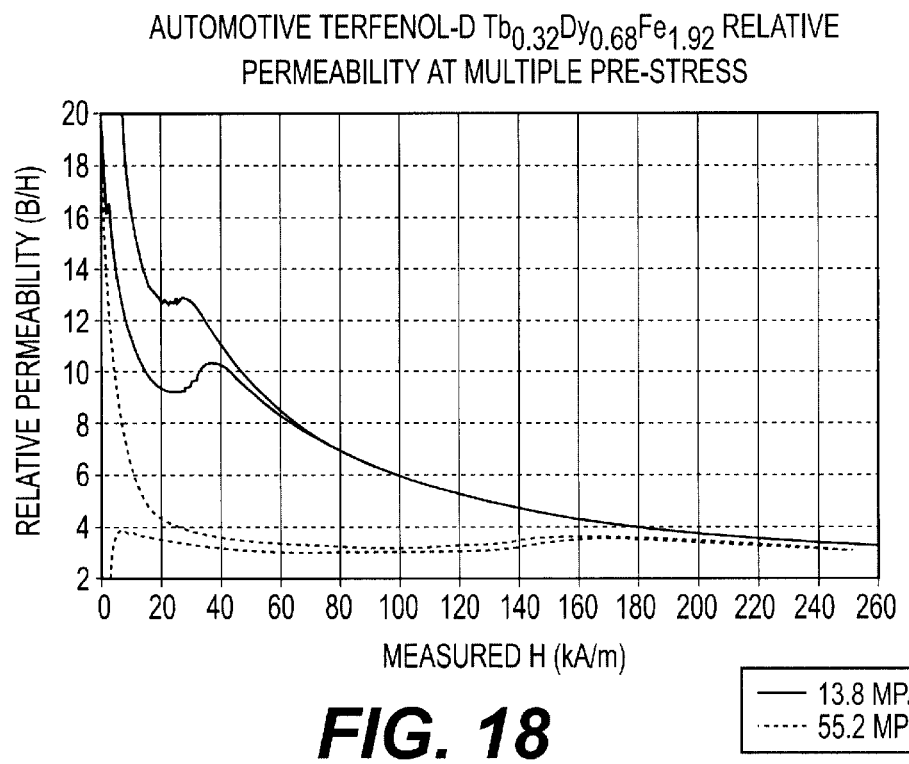
FIG. 18 depicts the magnetic permeability characteristic of a preferred Terfenol-D alloy $Tb_{0.32}Dy_{0.68}Fe_{1.92}$ at multiple prestress values in accordance with a preferred embodiment of the present invention.

FIG. 17 depicts the magnetostrictive constant characteristic of a preferred Terfenol-D alloy Tb$_{0.32}$Dy$_{0.68}$Fe$_{1.92}$, FIG. 18 depicts the magnetic permeability characteristic of a preferred Terfenol-D alloy Tb$_{0.32}$Dy$_{0.68}$Fe$_{1.92}$ at multiple prestress values.

Figure 19:
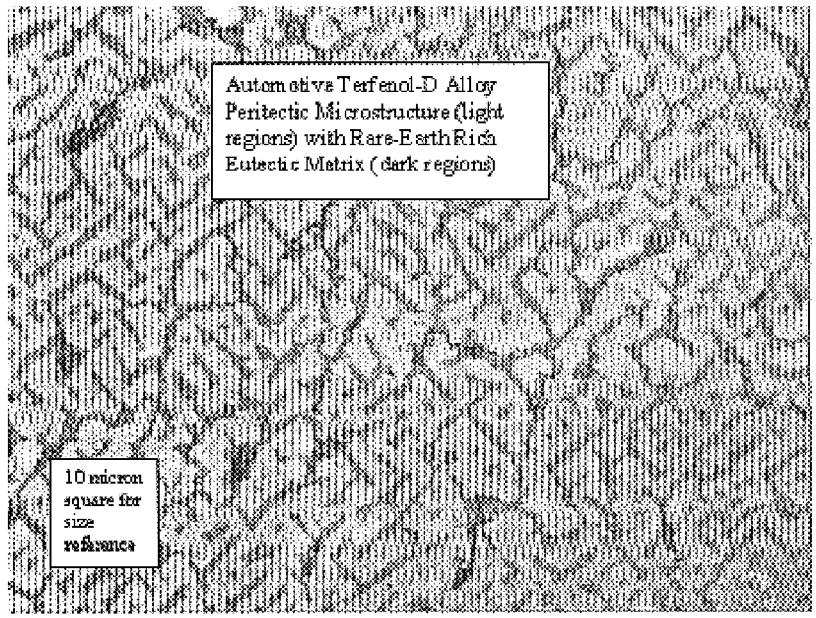
FIG. 19 is a representation of a micrograph depicting the microstructure of a preferred Terfenol-D alloy $Tb_{0.32}Dy_{0.68}Fe_{1.92}$ in accordance with a preferred embodiment of the present invention.

FIG. 19 is a representation of a micrograph depicting the microstructure of a preferred Terfenol-D alloy Tb$_{0.32}$Dy$_{0.68}$Fe$_{1.92}$.

Figure 20:
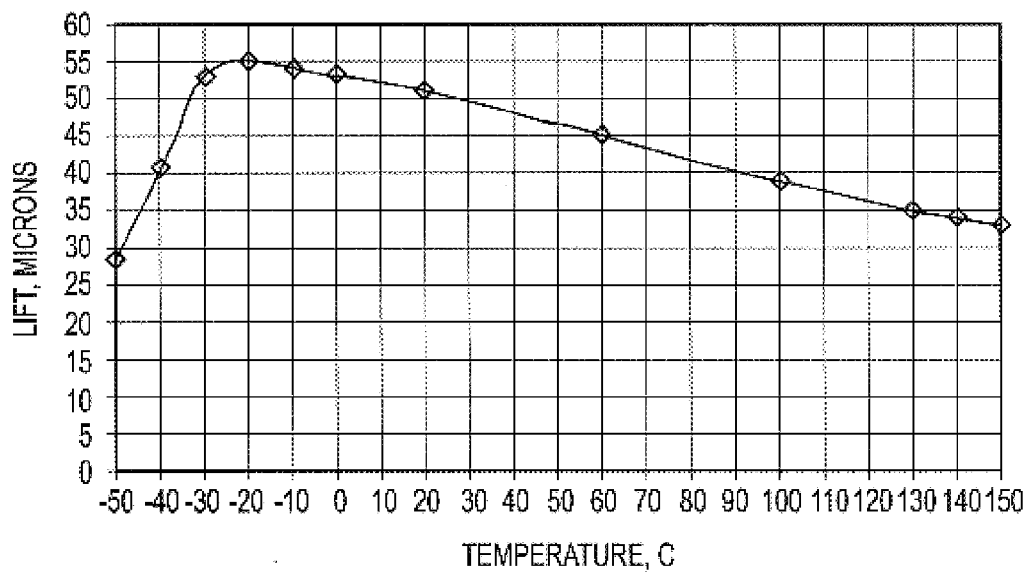
FIG. 20 depicts the improved temperature response of a preferred Terfenol-D alloy $Tb_{0.32}DY_{0.68}Fe_{1.92}$ in accordance with a preferred embodiment of the present invention.

FIG. 20 depicts the improved temperature response of a preferred Terfenol-D alloy $Tb_{0.32}Dy_{0.68}Fe_{1.92}$. A comparison of FIG. 20 with FIG. 4 indicates that the kneel temperature of the preferred alloy $Tb_{0.32}Dy_{0.68}Fe_{1.92}$ occurs at about −25° C., outside the typical automotive operating range. In contrast, the kneel temperature of the standard alloy ($Tb_{0.30}Dy_{0.70}Fe_{1.92}$) occurs at about 0° C., well within the typical automotive operating range. Further, the slope of the temperature response characteristic for the preferred Terfenol-D alloy $Tb_{0.32}Dy_{0.68}Fe_{1.92}$ is lower than the slope of the standard Terfenol-D composition ($Tb_{0.30}Dy_{0.70}Fe_{1.92}$), indicating that an improved temperature response may be obtained with the preferred Terfenol-D composition over the entire range of automotive operating temperatures.

While the present invention has been disclosed with reference to certain preferred embodiments, numerous modifications, alterations, and changes to the described embodiments are possible without departing from the sphere and scope of the present invention, as defined in the appended claims. Accordingly, it is intended that the present invention not be limited to the described embodiments, but have the full scope defined by the language of the following claims, and equivalents thereof.

What I claim is:

1. A fuel injector comprising:
   a body having an inlet port, an outlet port and a fuel passageway extending from the inlet port to the outlet port;
   a metering element disposed proximate the outlet port;
   a magnetostrictive element in operative contact with the metering element, wherein the composition of the magnetostrictive element consists essentially of a Terfenol-D alloy having the formula $Tb_xDy_{1-x}Fe_y$, wherein x ranges from about 0.31 to about 0.33 and y ranges from about 1.8 to about 2.2 so that the magnetostrictive element provides a substantially linear temperature response over the range of temperatures from approximately −40° C. to +150° C.; and
   a coil proximate the magnetostrictive element such that, upon excitation of the coil, magnetic flux generated by the coil causes the magnetostrictive element to change length and actuate the metering element.

2. The fuel injector according to claim 1 further comprising a spring means disposed in the body and operatively arranged to exert a predetermined prestress force on the magnetostrictive member.

3. The fuel injector of claim 2, wherein the predetermined prestress force is in the range of about 13.8 MPa to 52.2 MPa.

4. The fuel injector of claim 3, wherein the metering element comprises a needle tip that retracts inward toward the body of the injector as the length of the magnetostrictive element increases under the influence of magnetic flux.

5. The fuel injector of claim 3, wherein the metering element comprises a needle tip that extends outward away from the body of the injector as the length of the magnetostrictive element increases under the influence of magnetic flux.

6. A fuel injector comprising:
   a body having an inlet port, an outlet port and a fuel passageway extending from the inlet port to the outlet port;
   a metering element disposed proximate the outlet port;
   a magnetostrictive element in operative contact with the metering element, wherein the composition of the magnetostrictive element provides a substantially linear temperature response over the range of temperatures from approximately −40° C. to +150° C.; and
   a coil proximate the magnetostrictive element such that, upon excitation of the coil, magnetic flux generated by the coil causes the magnetostrictive element to change length and actuate the metering element.

7. The fuel injector according to claim 6, wherein the composition of the magnetostrictive element consists essentially of a Terfenol-D alloy having the formula $Tb_xDy_{1-x}Fe_y$, wherein x ranges from about 0.31 to about 0.33 and y ranges from about 1.8 to about 2.2.

8. The fuel injector according to claim 7 further comprising a spring means disposed in the body and operatively arranged to exert a predetermined prestress force on the magnetostrictive member.

9. The fuel injector of claim 8, wherein the predetermined prestress force is in the range of about 13.8 MPa to 52.2 MPa.

10. The fuel injector of claim 9, wherein the metering element comprises a needle tip that retracts inward toward the body of the injector as the length of the magnetostrictive element increases under the influence of magnetic flux.

11. The fuel injector of claim 9, wherein the metering element comprises a needle tip that extends outward away from the body of the injector as the length of the magnetostrictive element increases under the influence of magnetic flux.

12. A compound for use in a magnetostrictive valve, the compound consisting essentially of the formula:
   $Tb_xDy_{1-x}Fe_y$, wherein x ranges from about 0.31 to about 0.33 and y ranges from about 1.8 to about 2.2 so that the compound exhibits substantially linear temperature response from approximately −40° C. to +150° C.

13. The compound according to claim 12, wherein the compound is formed into a magnetostrictive rod and located in the body of a fuel injector to actuate a fuel injector metering mechanism.

14. The compound according to claim 13, wherein a predetermined prestress force of about 13.8 MPa to 52.2 MPa is exerted on the magnetostrictive rod.

15. A method of using a compound of the formula $Tb_xDy_{1-x}Fe_y$ to form a fuel injector, wherein x ranges from about 0.31 to about 0.33 and y ranges from about 1.8 to about 2.2, the method comprising forming the compound into a magnetostrictive element for use as a magnetostrictive actuator in a fuel injector so that the magnetostrictive element provides a substantially linear temperature response over the range of temperatures from approximately −40° C. to +150° C.

16. The method according to claim 15, further comprising:
   providing a body having an inlet port, an outlet port and a fuel passageway extending from the inlet port to the outlet port;
   providing a metering element disposed proximate the outlet port;
   providing a magnetostrictive element in operative contact with the metering element; and
   providing a coil proximate the magnetostrictive element such that, upon excitation of the coil, magnetic flux generated by the coil causes the magnetostrictive element to change length and actuate the metering element.

17. The method according to claim 16, further comprising exerting a predetermined prestress force in the range of about 13.8 MPa to 52.2 MPa on the magnetostrictive element.

18. The method of claim 16, further comprising:

iteratively selecting a magnetostrictive element with a Terbium content sufficient to provide a generally linear percent displacement as measured over each one of the temperatures at −30° C., −25° C., −20° C., −15° C., −10° C., −5° C., +5° C., +20° C.; and iteratively prestressing the selected magnetostrictive element at a prestress level sufficient to provide a generally linear percent displacement over each of the temperatures of +20° C., +60° C. and +100° C.

* * * * *